ELECTRONIC GATE CONTROLLED BY A DELAYED SIGNAL

Filed March 16, 1967 2 Sheets-Sheet 1

INVENTOR.
Achille CASTELLI
BY George V. Eltgroth and Joseph B. Forman
ATTORNEYS

ELECTRONIC GATE CONTROLLED BY A DELAYED SIGNAL

Filed March 16, 1967

INVENTOR.
Achille CASTELLI
BY George V Eltgroth and
Joseph B Forman
ATTORNEYS 3,512,018
Patented May 12, 1970

3,512,018

ELECTRONIC GATE CONTROLLED BY A DELAYED SIGNAL

Achille Castelli, Milan, Italy, assignor to General Electric Information Systems S.p.A., Caluso, Torino, Italy, a corporation of Italy Filed Mar. 16, 1967, Ser. No. 623,724
Claims priority, application Italy, Mar. 17, 1966, 15,636/66
Int. Cl. H03k 17/00
U.S. Cl. 307—320 2 Claims

ABSTRACT OF THE DISCLOSURE

An electronic gate controlled by a delayed signal, wherein a delay circuit comprises a capacitor having a capacity variable with the applied voltage, so as to obtain a control signal with a delayed enabling action, when applied, and a substantially undelayed inhibiting action, when removed, and having reduced uncertainty intervals between enabling and inhibiting condition.

This invention relates to an electronic gate controlled by a delayed enabling signal.

In particular, the invention relates to an electronic gate, adapt to selectively transfer a switching pulse from an input terminal to an output terminal under control by an enabling signal applied to an enable terminal, said gate comprising a capacitor and a diode, series connected between said input and said output terminals, and a resistor connected between said enable terminal and the point common to said diode and said capacitor.

Such a network, well known in the art, is described, for instance, in the volume "Digital Computer, Components and Circuits," by R. K. Richards, published by Van Nostrand, 1957, pp. 55–56. A very important characteristic of said gate is the delay separating the instants of application or removal of the enabling signal from the instants to which the diode is sufficiently biased to enable, or respectively to inhibit, the transfer of the switching pulse from the input to the output terminals.

The gate according to the invention may be used for instance to control the switching of a bistable multivibrator, being part of a counting network comprising a multiplicity of such bistable multivibrators, whose outputs control a logical network originating said enabling signal.

The switching pulse is applied to both inputs of the bistable multivibrator, one of said inputs being activated by the presence of the enabling signal, whereas the other one is inhibited by the absence of said enabling signal.

Following the application of the switching pulse to the activated input, the bistable multivibrator is switched. As a consequence, it may happen that the enabling signal, by the operation of the logical network, is removed from the formerly enabled input and applied to the formerly inhibited one.

However, to prevent the switching back of the multivibrator, it is necessary that the inhibited condition be removed by the enabling signal after a sufficient delay, so that said input remains inhibited during the whole duration of the switching pulse, even if the state of some of the bistable univibrators composing the counter is changing. On the contrary a delay in the change to inhibition from activation of the formerly activated input is in general not needed.

In known gates of said type, the delayed effect of the enabling pulse is due to the circumstance that said capacitor and said resistor act as an integrating circuit, therefore delaying the effect of the steep rise and fall fronts of the substantially rectangular enabling signal. Therefore, during a determined time interval (delay interval) from the instants of said steep rise and fall fronts, the transfer of the switching signal remains inhibited or, respectively enabled.

However, in the known gates, an uncertainty time interval follows said delay intervals, due to the fact that said integrating circuit substantially reduces the slope of said rise and fall fronts.

During said uncertainty intervals it is impossible to foresee with certainty if a switching pulse shall or shall not be transferred to the gate output.

It would be desirable that the rising front of the enabling signal, at the output of the gate, should be delayed by a determined amount, while remaining as steep as possible, while the fall front should remain as steep as possible, without being subjected to any appreciable delay.

These purposes are attained by the gate according to the present invention, characterized by a delaying circuit comprising a capacitor whose capacity depends from the applied voltage.

These and other features of the invention will appear clearly from the present description of a preferred embodiment thereof, taken in conjunction with the accompanying drawings, in which.

Figure 1:
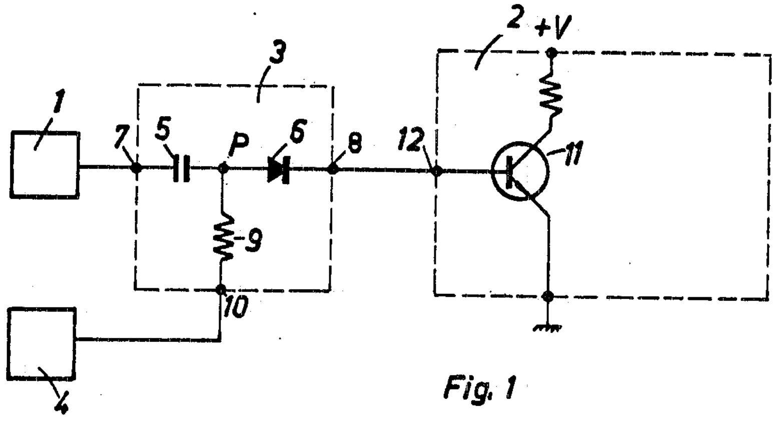
FIG. 1 represents a prior art electronic gate.

FIG. 1 represents an electronic gate as known in the prior art, used for controlling a bistable multivibrator 2, apt to be switched from one state to another by a switching pulse applied to input 12. It is assumed, in a way of example, that said input 12 is connected to the base of NPN transistor 11 in a common emitter circuit, said transistor being in non conductive state.

The bistable multivibrator 2 is switched when a positive switching pulse causes the transistor 11 to conduct.

Said switching pulses are delivered by a switching pulse generator 1, having negligible internal impedance and are transferred to the bistable multivibrator 2 through gate 3 controlled by an enabling signal source 4, having negligible internal impedance.

The gate 3 comprises a capacitor 5 and a diode 6, series connected between input terminal 7 and output terminal 8; and resistor 9 connected between enable terminal 10 and a point 9 common to said diode 6 and said capacitor 5. The operation of the network is as described hereunder.

We assume that the bistable multivibrator 2 is in a condition wherein transistor 11 is not conducting and terminal 8 is held at a voltage a little higher than 0 v., for instance 0.2 v. Furthermore we assume that, for generators 1 and 4, the absence of signal, that is the logical level ZERO, corresponds for instance to −5 v., and the presence of signal, that is the logical level ONE, corresponds to 0 v.

Figure 2:
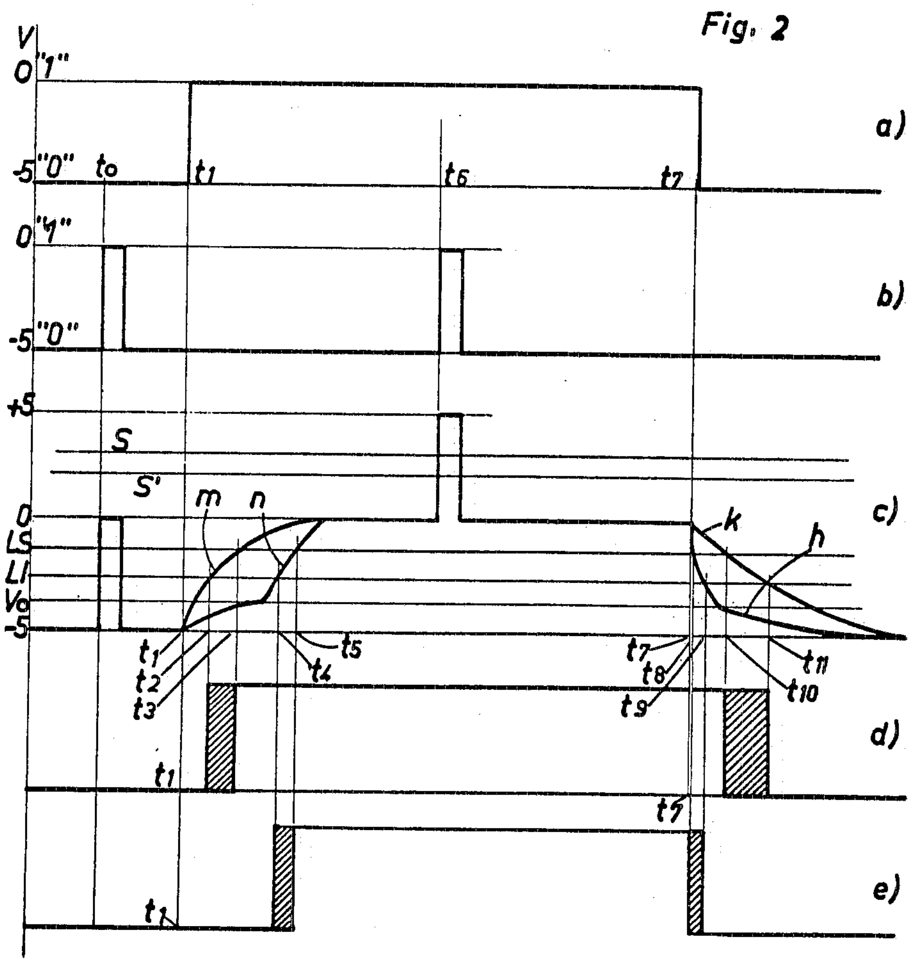
FIG. 2 shows the variation in time of some signals presents on circuits of FIG. 1 and 3.

Referring to FIG. 2 diagram (*a*) shows the idealized waveform of the voltage at terminal 10, to which the enabling signal is applied, while diagram (*b*) shows the idealized waveform of voltage at terminal 7, to which said switching pulse is applied.

At instant $t_0$, when the enabling signal is not present, diagram (*c*), indicating schematically the variation of the voltage at point P, shows that the +5 v. switching pulse cannot reach the voltage level comprised between lines S and S′, corresponding to the conduction threshold of diode 6, and able to transfer the signal to output 8 at an amplitude sufficient to cause the switching of the bistable multivibrator.

At instant $t_0$, on the contrary, the enabling signal is present, and the voltage switching pulse adds itself to the existing voltage at point P, causing the applied voltage to exceed the conduction threshold of diode 6 comprised between S and S′ and to transfer the switching signal to terminal 8 at an amplitude sufficient to cause the switching of the bistable multivibrator.

When the generator 4 applies at time $t_1$ to terminal 10 the steep rising front of the enabling signal, the voltage of point P does not rise abruptly, but, due to the circuit comprising resistor 9 and capacitor 5, it rises following an exponential curve, as indicated by curve *m* in FIG. 2*c*. Said curve has a time constant equal to RC, R being the resistance of resistor 9 and C the capacity of capacitor 5.

It must be kept in mind that the switching of the bistable multivibrator 2 takes place at a voltage higher than a given threshold level: but said level is not an unique and well determined value, but an interval of voltage values, comprised between an upper and a lower limit S and S′.

A signal whose amplitude is comprised within said limits has only a certain probability to cause the switching of the bistable multivibrator.

Consequently, also the voltage values of point P, as determined by the enabling signal, comprises an interval, delimitated by a upper and lower limit LS and LI, characterized by the uncertainty of the switching operation.

Due to the slope of the rising voltage, to said uncertainty of the switching operation corresponds an uncertainty in the switching instant.

In fact, the switching pulses, applied to input 7 at instants subsequent to $t_1$ up to $t_2$, are not transferred to the output with an amplitude sufficient to cause the swiching, whereas the pulses applied to terminal 7 after the instant $t_3$ certainly cause said switching.

Therefore there is an uncertainty time interval, comprised between $t_2$ and $t_3$, during which the control pulses have only a certain probability to cause the switching of the multivibrator.

Likewise, when the enabling signal, applied by generator 4 to input 10, falls steeply at instant $t_7$, the voltage of point P does not fall abruptly, but according to an exponential law having the time constant RC, as represented by curve *k* of FIG. 2*c*. Therefore the switching pulses, applied to terminal 7, at the instants following $t_7$ up to $t_{10}$, are transferred to output 8 with sufficient amplitude to switch the bistable multivibrator, whereas the switching pulses applied to input 7 after instant $t_{11}$, certainly do not cause the switching of the multivibrator.

Also in this case, therefore, there is an uncertainty interval, comprised between $t_{10}$ and $t_{11}$.

It is clear that the gate represented in FIG. 1 operates as if the enabling signal had the steep rising front delayed by an interval at least equal to $t_1$–$t_2$; and the steep falling front delayed by an interval at least equal to $t_7$–$t_{10}$; being, in addition, possible that said rising front occurs quite casually in the interval $t_2$–$t_3$ and that said falling front occurs in the interval $t_{10}$–$t_{11}$.

Said uncertainty time intervals, represented by the hatchings in FIG. 2*d*, are an inconvenience of said type of gate, and it is very important to reduce them without reducing the delay intervals.

The gate according to the invention (FIG. 3) comprises, in the place of resistor 9 of FIG. 1, two resistors 13 and 14.

A capacitor 15, having a capacity varying with the applied voltage, is connected between point Q, common to said resistors 13 and 14, and a terminal held at constant voltage, for instance —5 v.

Said variable capacity is, according to a preferred embodiment of the invention, a diode of the type described in French Pat. No. 1,452,611 filed on Oct. 29, 1964, in the name of Ing. C. Olivetti & C., S.p.A.

Figures 3, 4, 5:
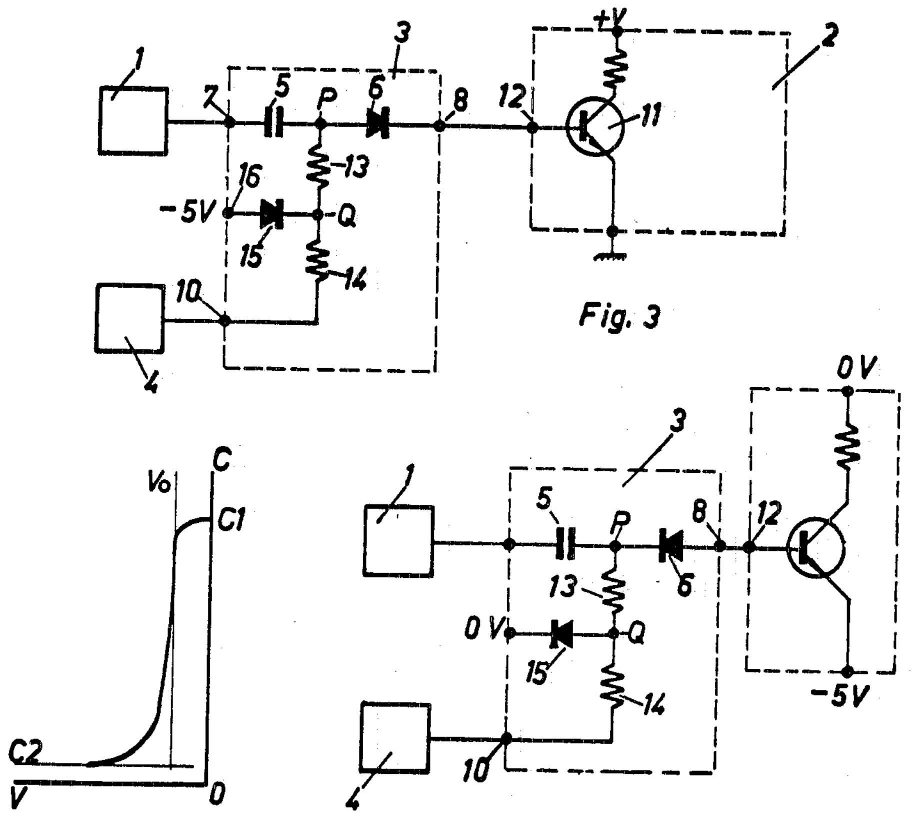
FIG. 3 represents the electronic gate according to an embodiment of the invention.
FIG. 4 shows the variation of capacity with voltage for a variable-capacity diode.
FIG. 5 represents another embodiment of the invention.

Said diode presents, among its characteristics, a strong variation of capacity in dependance of the applied voltage, as shown by FIG. 4. By reverse biasing, up to a certain critical value of reverse voltage $V_0$, said diode has a high, nearly constant capacity $C_1$ while by reverse voltages exceeding said critical value the capacity diminishes rapidly approaching a much smaller constant value $C_2$. In some samples of said diodes the ratio of capacity $C_2$ to capacity $C_1$ is of the order of 20 or 10 to 1, the critical value of the reverse bias voltage $V_0$ being approximately 0.5 v.

The operation of the gate according to the invention is as follows:

When the enabling signal due to generator 4 is applied to input 10, the voltage of point Q in respect to earth is approximately —5 v., and therefore the voltage applied to the diode 15 is small. In these conditions the capacity of said diode is large, hence the voltage of point P rises very slowly, because the current flowing through resistance 14 must charge said relatively large capacity $C_1$.

The voltage of point Q also rises, and, when it has reached the critical value $V_0$, the capacity of diode 15 falls sharply to the lower value $C_2$, and the voltage of point P rises quickly. On the whole the law of variation of the voltage of point P is represented approximately by curve *n* FIG. 2*c*.

When the steady state is reached, for instance at instant $t_6$, diode 15 is reversely biased by a voltage of about 5 v., therefore remaining in the low capacity condition.

As the enabling signal is removed, the capacity of diode 15 is initially small. Therefore the voltage of point P falls rapidly until the voltage of point Q has reached the critical value $V_0$, relatively to the voltage —5 v. of terminal 16. Furtherly, the diode 15 goes in the large capacity condition, and the voltage varies much more slowly. On the whole the law of variation of the voltage of point P, during the falling transient, is represented by curve *h* of FIG. 2*c*.

By appropriately choosing the capacity of capacitor 5, and the resistance of resistors 13 and 14, an increased delay of the rising front of the enabling signal may be obtained, as shown in FIG. 2*e*, while increasing the slope of the curve in correspondance of the passage through the uncertainty zone between voltages LS and LI, and therefore obtaining a reduction of the uncertainty interval $t_3$–$t_4$. At the same time, a reduction of the uncertainty interval $t_8$–$t_9$ in the fall front is obtained, and a smaller delay relatively to the theoretical instant $t_7$ of the ceasing of the enable condition.

The behaviour of the effective enabling signal as represented in FIG. 2*c* is therefore much more convenient to the intended purposes than the one of FIG. 2*d*, as obtained by the prior art.

The device described may be arranged in different ways according to different circuit dispositions and to different purposes pursued. FIG. 5 represents a circuit, similar to the one of FIG. 3, wherein the switching pulses and the enabling signal are both negative, the switching pulse being intended to switch the transistor from the conducting to the non conducting state.

Figure 6:
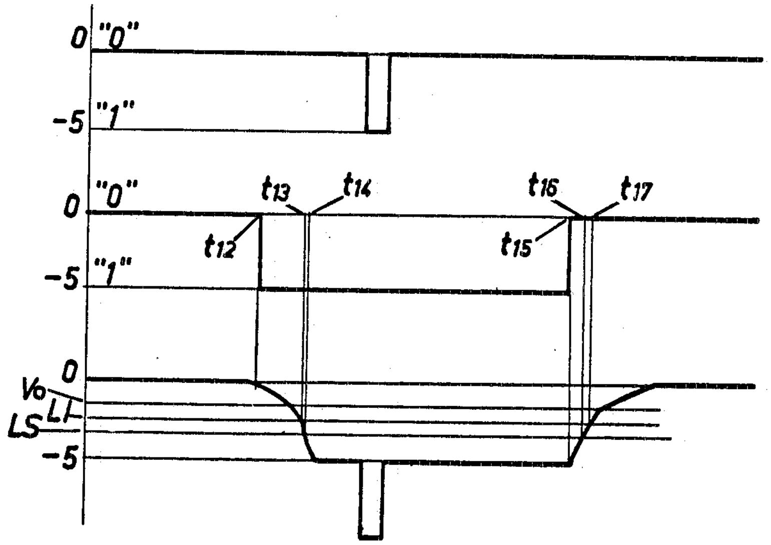
FIG. 6 represents the variation in time of some signals presents on the gate of FIG. 5.

In this case, as shown by FIG. 6 the variable capacity condenser causes a delay in the falling front and therefore a lengthening of the inhibited condition equal to the interval $t_{13}t_{14}$, and a reduction of the uncertainty interval $t_{13}t_{14}$.

The delay for the rising front is the small interval $t_{15}t_{16}$ and the uncertainty interval is $t_{16}t_{17}$.

What is claimed is:

1. An electronic gate for selectively transferring a switching pulse from an input terminal to an output terminal under control of an enabling signal applied to an enable terminal, comprising at least a first capacitor and a diode, series connected between said input terminal and said output terminal, and a delay circuit comprising at least a first resistor and said first capacitor; said first resistor having first terminal connected to the common terminal of said first capacitor and said diode, and having second terminal connected to an enabling signal source, wherein the improvement comprises at least a second capacitor being part of said delay circuit and having a capacity variable with the applied voltage, said second capacitor having one terminal connected to a suitable voltage reference source.

2. An improved electronic gate as claimed in claim 1, wherein the improvement comprises at least a second resistor included in said delay circuit between the enable terminal and said first resistor, the variable capacity capacitor being connected between the point common to said first and second resistor and a point held to an appropriated fixed voltage.

References Cited

UNITED STATES PATENTS 3,167,730 1/1965 Anderson et al. ------- 334—15

JOHN S. HEYMAN, Primary Examiner

D. M. CARTER, Assistant Examiner

U.S. Cl. X.R.

307—239, 246, 285